(12) United States Patent
Pappu et al.

(10) Patent No.: US 10,951,176 B2
(45) Date of Patent: Mar. 16, 2021

(54) HIGHLY LINEAR LOW NOISE TRANSCONDUCTOR

(71) Applicant: Maxlinear, Inc., Carlsbad, CA (US)

(72) Inventors: Anand Mohan Pappu, Bengaluru (IN); Ranjit Kumar Guntreddi, Bengaluru (IN); Madhusudan Govindarajan, Bengaluru (IN); Pranjal Pandey, Bengaluru (IN)

( * ) Notice: Subject to any disclaimer, the term of this patent is extended or adjusted under 35 U.S.C. 154(b) by 9 days.

(21) Appl. No.: 16/400,483

(22) Filed: May 1, 2019

(65) Prior Publication Data

US 2019/0341892 A1    Nov. 7, 2019

Related U.S. Application Data

(60) Provisional application No. 62/686,698, filed on Jun. 19, 2018.

(30) Foreign Application Priority Data

May 2, 2018   (IN) .............................. 201811016617

(51) Int. Cl.
*H03F 1/34* (2006.01)
*H03F 3/45* (2006.01)
*H03F 1/22* (2006.01)
*H03F 1/32* (2006.01)

(52) U.S. Cl.
CPC ............ *H03F 1/342* (2013.01); *H03F 1/223* (2013.01); *H03F 1/3205* (2013.01); *H03F 3/45179* (2013.01); *H03F 2200/135* (2013.01); *H03F 2200/294* (2013.01); *H03F 2203/45288* (2013.01); *H03F 2203/45336* (2013.01)

(58) Field of Classification Search
CPC ....................................................... H03F 1/342
See application file for complete search history.

(56) References Cited

U.S. PATENT DOCUMENTS

| | | | | |
|---|---|---|---|---|
| 3,921,090 | A * | 11/1975 | Wheatley, Jr. ...... | H03F 3/45071 330/257 |
| 6,744,320 | B2* | 6/2004 | Nguyen ................ | H03F 1/3211 330/253 |
| 7,414,481 | B2* | 8/2008 | Li .......................... | H03B 27/00 330/165 |
| 7,853,235 | B2* | 12/2010 | Aparin .................... | H03F 1/301 455/341 |
| 10,447,218 | B1* | 10/2019 | Xie .......................... | G05F 3/16 |
| 2012/0293259 | A1* | 11/2012 | Riekki ..................... | H03F 1/26 330/253 |
| 2016/0126896 | A1* | 5/2016 | Choksi ................ | H03F 3/45071 330/296 |
| 2019/0296756 | A1* | 9/2019 | Ali ........................ | H03M 1/002 |

* cited by examiner

*Primary Examiner* — Patricia T Nguyen
(74) *Attorney, Agent, or Firm* — Maschoff Brennan

(57) ABSTRACT

A transconductance circuit comprises a first transistor, a second transistor, a first source-degeneration device, a second source-degeneration device, a first feedback device, and a second feedback device. The gate node of the first transistor is coupled to a source node of the second transistor via the first feedback device. The gate node of the second transistor is coupled to a source node of the second transistor via the second feedback device. The source node of the first transistor is coupled to a reference voltage via the first source-degeneration device. The source node of the second transistor is coupled to the reference voltage via the second source-degeneration device.

19 Claims, 4 Drawing Sheets

HIGHLY LINEAR LOW NOISE TRANSCONDUCTOR

PRIORITY CLAIM

This application claims priority to Indian Provisional Patent Application 201811016617 Filed May 2, 2018 and to U.S. Provisional Application 62/686,698 filed Jun. 19, 2018, each of which is hereby incorporated herein by reference in its entirety.

BACKGROUND

Limitations and disadvantages of conventional and traditional approaches to transconductors will become apparent to one of skill in the art, through comparison of such systems with some aspects of the present invention as set forth in the remainder of the present application with reference to the drawings.

BRIEF SUMMARY OF THE INVENTION

A system and/or method is provided for a highly-linear, low-noise transconductor, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

A transconductor ideally generates a current output proportional to its input voltage. One form of a transconductor is a metal-oxide-semiconductor (MOS) device biased in its saturation region. The small-signal drain current of such a transistor can be expressed as:

$$i_d = g_m v_{gs} + g_{m3} v_{gs}^3 + g_{ds} v_{ds} + g_{ds3} v_{ds}^3,$$

where $g_{m3}$ and $g_{ds3}$ are the coefficients of $3^{rd}$ order terms of the polynomial. The signs of $g_{m3}$ and $g_{ds3}$ depend on the nature of the non-linearity (i.e., whether it is expansive or compressive). If $v_{gs} \ll v_{dsat}$ and $v_{ds} \gg v_{dsat}$, then the behavior of the MOS approaches that of an ideal, linear transconductor.

A MOS transconductor can be connected in feedback such that the effective $v_{gs}$ is lowered and the linearity is improved. For example, the degenerating resistor 108 in FIG. 1A converts the output current of MOS device 102 into a voltage which opposes the input voltage. As the $v_{gs}$ seen by the MOS device 102 decreases, the non-linearity also decreases.

Figure 2:
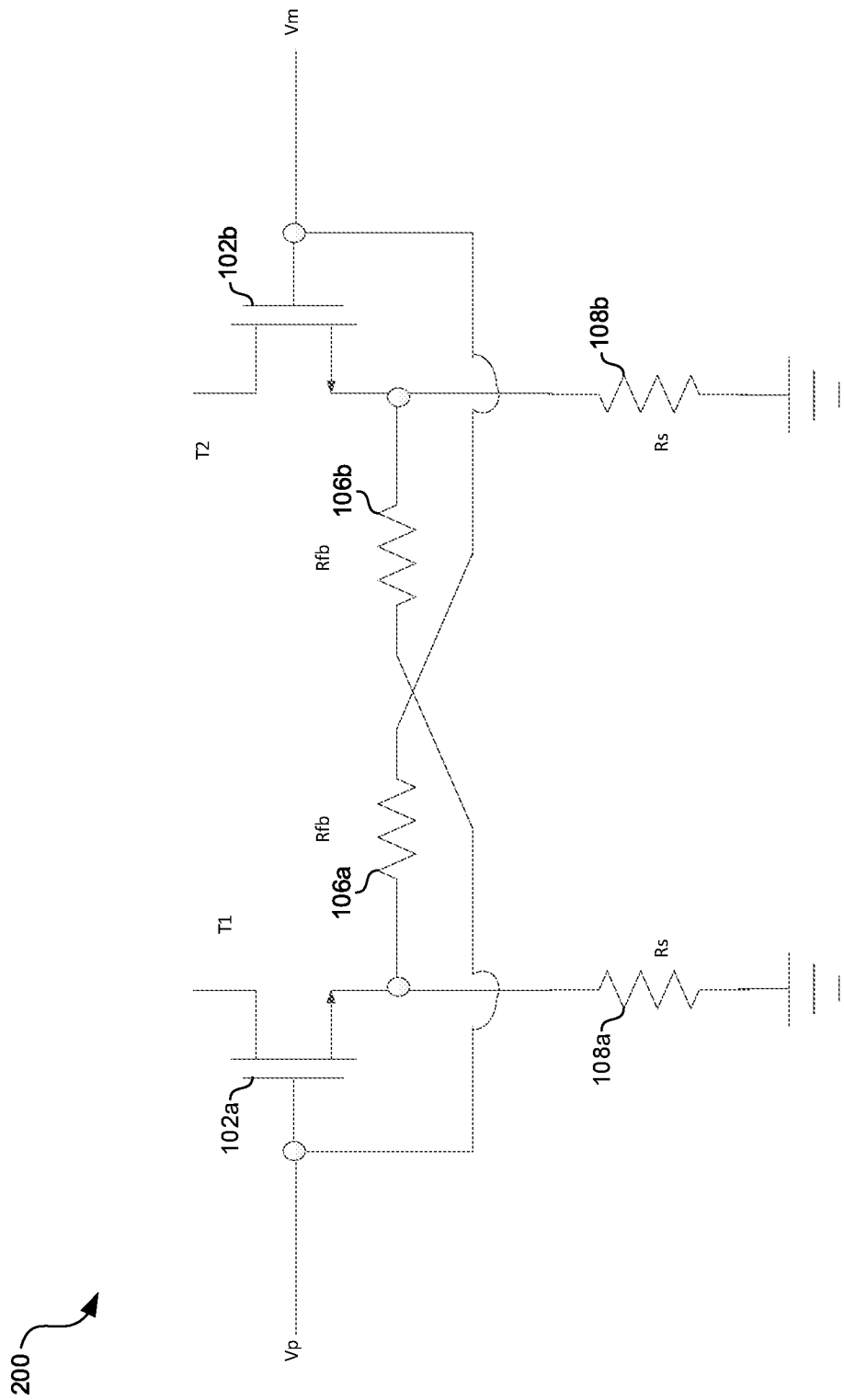
FIG. 2 shows a first example resistive feedback low noise amplifier architecture.

Referring to FIG. 2, there is shown a first example resistive-feedback, low-noise amplifier architecture. The LNA 200 comprises two MOS devices 102a and 102b, degeneration resistors 108a and 108b coupled between the sources of devices 102a and 102b and a reference voltage (e.g., ground), and feedback resistors 106a and 106b coupled between the source of one of the devices 102a and 102b and the gate of the other of the two devices 102a and 102b.

The architecture of LNA 200 achieves input termination via the feedback resistors 106a and 106b. Noise of the feedback resistors 106a and 106b gets converted to common-mode noise and the structure achieves differential noise cancellation for noise of the feedback resistors 106a and 106b. This improves noise figure metric of LNA.

Other benefits of the architecture of LNA 200 include: low noise figure while allowing a current bias of the transistors 102a and 102b via a resistor to improve noise; no need for inductors, which generally require a lot of area; and improved linearity with the degeneration of the transistors 102a and 102b.

Along with improving linearity, the resistors 108a and 108b provide paths for bias current, eliminating the need for a biasing transistor, which would have introduced additional noise.

In an example implementation, the resistors 106a and 106b are chosen to approximately match the differential source impedance. In an example implementation, the noise contribution of resistors 106a and 106b is less than 1% of total noise of the LNA 200. Thus, the termination noise is approximately eliminated.

Figure 1:
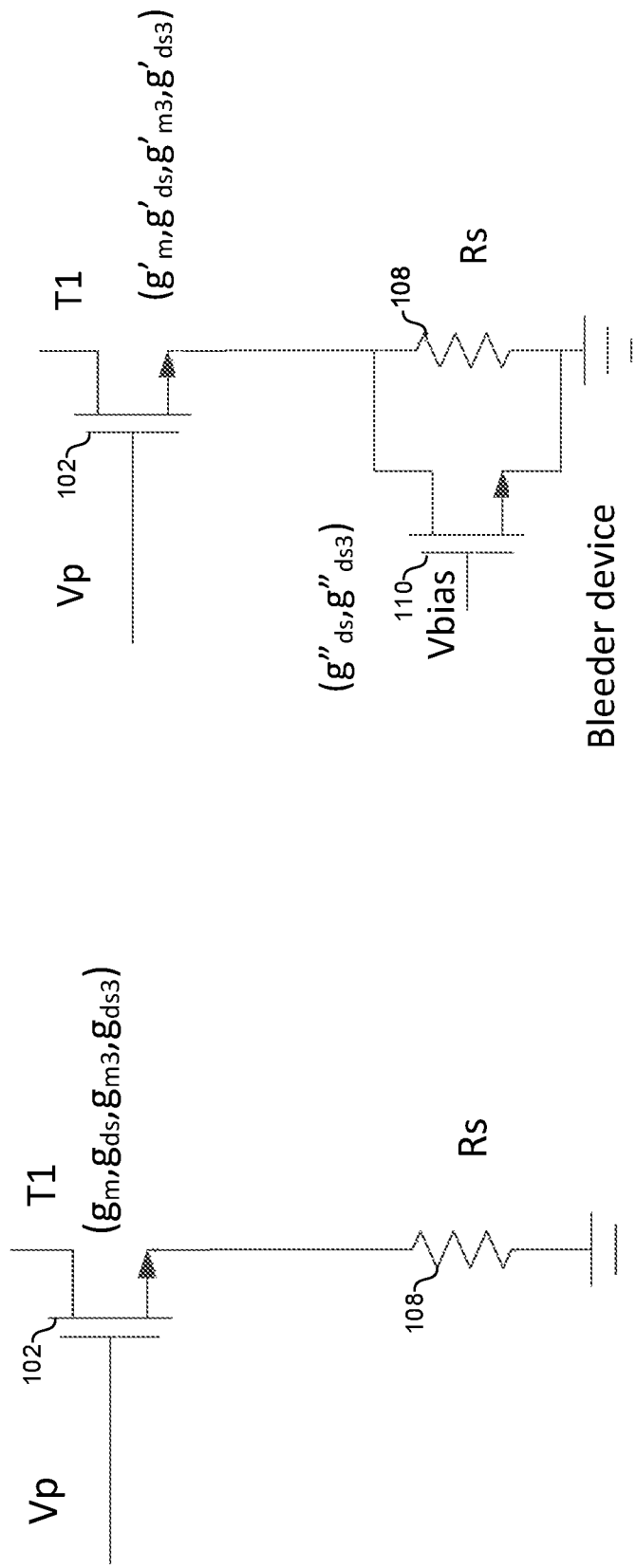
FIGS. 1A and 1B illustrate techniques for linearizing a transconductor.

Referring to FIG. 1B, Linearity of the degenerated device 102 in FIG. 1A can be further enhanced by adding a bleeder current source 110 with gds non-linearity, as shown in FIG. 1B. The small signal ids of the MOS device 102 in FIG. 1B can be expressed as:

$$i_d = g'_m * \frac{v_p}{1+g'_m R'_s} + \frac{g'_{m3}}{1+g'_m R'_s}\left(\frac{v_p}{1+g'_m R'_s}\right)^3 + g'_{ds}\left(\frac{v_p g'_m R'_s}{1+g'_m R'_s}\right) + \frac{g'_{ds3}}{1+g'_m R'_s}\left(\frac{v_p g'_m R'_s}{1+g'_m R'_s}\right)^3 + \left(\frac{g''_{ds}}{1+g'_m R'_s}\right)v_p + \frac{g'_{ds3}}{(1+g'_m R'_s)^4}v_p^3.$$

As $g_{ds3}''$ and $g_{m3}'$ are generally opposite in signs, there will be a reduction in total nonlinear current and improvement in linearity performance.

Figure 3:
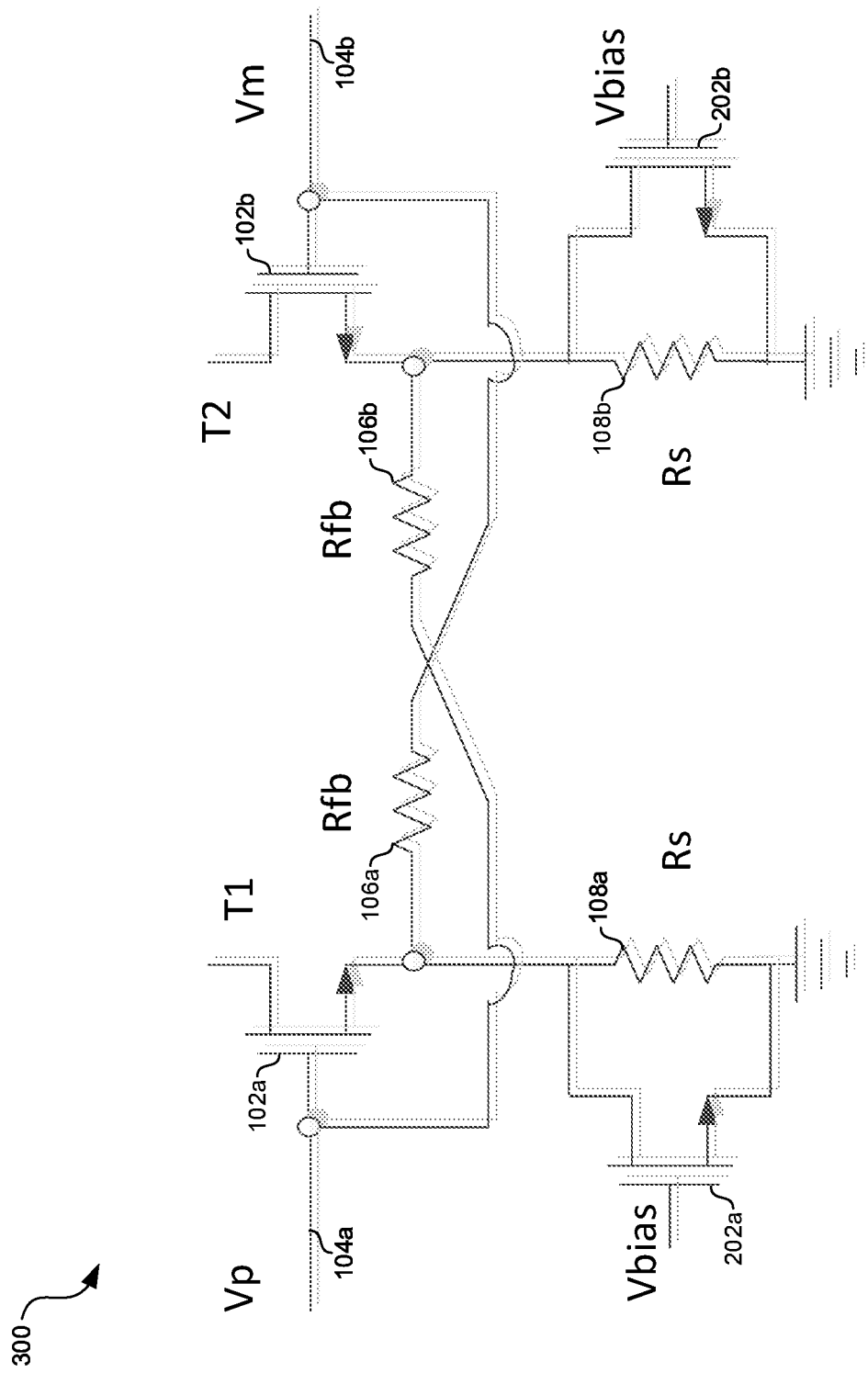
FIG. 3 shows a second example resistive feedback low noise amplifier architecture.

Referring to FIG. 3, there is shown a second example resistive-feedback low noise amplifier architecture 300 comprising bleeder devices 202a and 202b to provide improved noise figure and linearity.

Aspects of this disclosure provide circuit architectures in which noise cancellation of the input termination device is achieved by converting its noise into common-mode noise.

Aspects of this disclosure provide differential input, differential output transconductance circuit architectures in which feedback is fed from the positive terminal of one half of the differential circuit to the negative terminal of the other half of the differential circuit.

Figure 4:
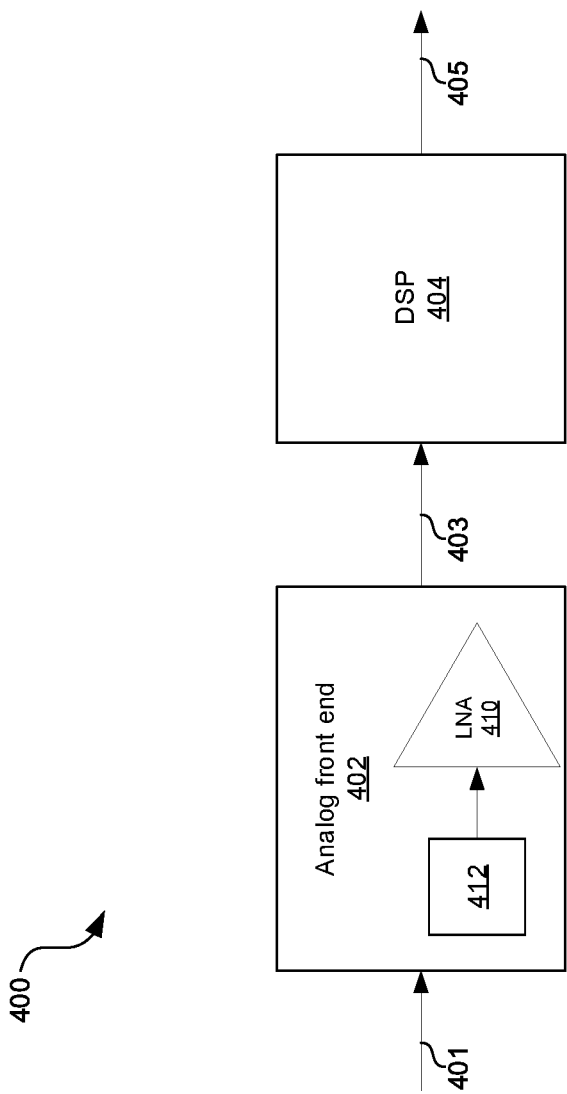
FIG. 4 shows a receiver comprising an instance of a resistive-feedback, low-noise amplifier such as is shown in FIG. 2 or FIG. 3.

FIG. 4 shows a receiver comprising an instance of a resistive-feedback, low-noise amplifier such as is shown in FIG. 2 or FIG. 3. The receiver 400 comprises analog front end circuitry 402 and digital signal processing circuitry 404.

The analog front end 402 comprises circuitry for processing signal 401 received over a (wired or wireless) channel to generate signal 403xpdf. The processing includes processing by a circuit 412 (e.g., a filter) which then drives the LNA 410, which may be an instance of the amplifier 200 of FIG. 2 or the amplifier 300 of FIG. 3. Other processing performed by the analog front end 402 may include filtering, down-conversion, and analog-to-digital conversion.

The digital signal processing circuitry 404 comprises circuitry operable to process the signal 403 to generate the signal 405. Such processing may comprise, for example, equalization, demodulation, decoding, and/or the like to recover information carried in the signal 403 and output the recovered information as signal 405.

In accordance with an example implementation of this disclosure, a transconductance circuit (e.g., 300) comprises a first transistor (e.g., 102a), a second transistor (e.g., 102b), a first source-degeneration device (e.g., resistor 108a but could be any suitable impedance), a second source-degeneration device (e.g., resistor 108a but could be any suitable impedance), a first feedback device (e.g., resistor 106b but could be any suitable impedance), and a second feedback device (e.g., resistor 106a but could be any suitable impedance). The gate node of the first transistor is coupled to a source node of the second transistor via the first feedback device. The gate node of the second transistor is coupled to a source node of the second transistor via the second feedback device. The source node of the first transistor is coupled to a reference voltage via the first source-degeneration device. The source node of the second transistor is coupled to the reference voltage via the second source-degeneration device. The transconductance circuit may comprise a first bleeder device (e.g., 202a) and a second bleeder device (e.g., 202b). The first bleeder device may be coupled in parallel with the first source-degeneration device. The second bleeder device may be coupled in parallel with the second source-degeneration device. The first bleeder device may comprise a third transistor and the second bleeder device may comprise a fourth transistor. The impedance of the first feedback device may be equal (e.g., to within 10%, 5%, or any other suitable tolerance for the particular application as determined, for example, by a noise figure of the transconductance circuit) of the output impedance of a circuit that provides the input voltage (e.g., output impedance of circuit 412). The impedance of the second feedback device may be equal (e.g., to within 10%, 5%, or any other suitable tolerance for the particular application as determined, for example, by a noise figure of the transconductance circuit) of the output impedance of a circuit that provides the input voltage (e.g., output impedance of circuit 412). The transconductance circuit may be configured to convert an input voltage (e.g., Vp–Vm) to an output current (e.g., the current at the drains of the first transistor and the second transistor). The first transistor and the second transistor may be metal-oxide-semiconductor (MOS) devices (e.g., n-channel or p-channel MOSFETs). The first feedback device may be a first resistor (e.g., realized in a one or more metal and/or polysilicon layer(s)) and the second feedback device is a second resistor (e.g., realized in a one or more metal and/or polysilicon layer(s)). The first source-degeneration device may be a third resistor (e.g., realized in a one or more metal and/or polysilicon layer(s)) and the second source-degeneration device may be a fourth resistor (e.g., realized in a one or more metal and/or polysilicon layer(s)).

As utilized herein the terms "circuits" and "circuitry" refer to physical electronic components (i.e. hardware) and any software and/or firmware ("code") which may configure the hardware, be executed by the hardware, and or otherwise be associated with the hardware. As used herein, for example, a particular processor and memory may comprise a first "circuit" when executing a first one or more lines of code and may comprise a second "circuit" when executing a second one or more lines of code. As utilized herein, "and/or" means any one or more of the items in the list joined by "and/or". As an example, "x and/or y" means any element of the three-element set {(x), (y), (x, y)}. In other words, "x and/or y" means "one or both of x and y". As another example, "x, y, and/or z" means any element of the seven-element set {(x), (y), (z), (x, y), (x, z), (y, z), (x, y, z)}. In other words, "x, y and/or z" means "one or more of x, y and z". As utilized herein, the term "exemplary" means serving as a non-limiting example, instance, or illustration. As utilized herein, the terms "e.g.," and "for example" set off lists of one or more non-limiting examples, instances, or illustrations. As utilized herein, circuitry is "operable" to perform a function whenever the circuitry comprises the necessary hardware and code (if any is necessary) to perform the function, regardless of whether performance of the function is disabled or not enabled (e.g., by a user-configurable setting, factory trim, etc.).

Other embodiments of the invention may provide a non-transitory computer readable medium and/or storage medium, and/or a non-transitory machine readable medium and/or storage medium, having stored thereon, a machine code and/or a computer program having at least one code section executable by a machine and/or a computer, thereby causing the machine and/or computer to perform the processes as described herein.

Accordingly, the present invention may be realized in hardware, software, or a combination of hardware and software. The present invention may be realized in a centralized fashion in at least one computing system, or in a distributed fashion where different elements are spread across several interconnected computing systems. Any kind of computing system or other apparatus adapted for carrying out the methods described herein is suited. A typical combination of hardware and software may be a general-purpose computing system with a program or other code that, when being loaded and executed, controls the computing system such that it carries out the methods described herein. Another typical implementation may comprise an application specific integrated circuit or chip.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A system comprising:
a transconductance circuit configured to convert an input voltage to an output current, the transconductance circuit comprising a first transistor, a second transistor, a first source-degeneration device, a second source-degeneration device, a first feedback device, and a second feedback device, wherein:
a gate node of the first transistor is coupled to a source node of the second transistor via the first feedback device;
a gate node of the second transistor is coupled to a source node of the second transistor via the second feedback device;
the source node of the first transistor is coupled to a reference voltage via the first source-degeneration device; and
the source node of the second transistor is coupled to the reference voltage via the second source-degeneration device.

2. The system of claim 1, comprising a first bleeder device and a second bleeder device.

3. The system of claim 2, wherein:
the first bleeder device is coupled in parallel with the first source-degeneration device; and
the second bleeder device is coupled in parallel with the second source-degeneration device.

4. The system of claim 2, wherein the first bleeder device comprises a third transistor and the second bleeder device comprises a fourth transistor.

5. The system of claim 1, wherein:
an impedance of the first feedback device is equal, to within 5%, of an output impedance of a circuit that provides the input voltage; and
an impedance of the second feedback device is equal, to within 5%, of an output impedance of a circuit that provides the input voltage.

6. The system of claim 1, wherein:
the input voltage is a differential signal; and
the transconductance circuit is configured to receive the input voltage across gate nodes of the first transistor and the second transistor.

7. The system of claim 1, wherein:
the output current is a differential signal; and
the transconductance circuit is configured to provide the output current at drain nodes of the first transistor and the second transistor.

8. The system of claim 1, wherein the first transistor and the second transistor are metal-oxide-semiconductor (MOS) devices.

9. A system comprising:
a transconductance circuit comprising a first transistor, a second transistor, a first source-degeneration device, a second source-degeneration device, a first feedback device, and a second feedback device, wherein:
a gate node of the first transistor is coupled to a source node of the second transistor via the first feedback device;
a gate node of the second transistor is coupled to a source node of the second transistor via the second feedback device;
the source node of the first transistor is coupled to a reference voltage via the first source-degeneration device; and
the source node of the second transistor is coupled to the reference voltage via the second source-degeneration device.

10. The system of claim 9, comprising a first bleeder device and a second bleeder device.

11. The system of claim 10, wherein:
the first bleeder device is coupled in parallel with the first source-degeneration device; and
the second bleeder device is coupled in parallel with the second source-degeneration device.

12. The system of claim 10, wherein the first bleeder device comprises a third transistor and the second bleeder device comprises a fourth transistor.

13. The system of claim 9, wherein:
an impedance of the first feedback device is equal, to within 5%, of an output impedance of a circuit that provides an input voltage or current to the transconductance circuit; and
an impedance of the second feedback device is equal, to within 5%, of an output impedance of a circuit that provides an input voltage or current to the transconductance circuit.

14. The system of claim 9, wherein the transconductance circuit is configured to convert an input voltage to an output current.

15. The system of claim 14, wherein:
the input voltage is a differential signal; and
the transconductance circuit is configured to receive the input voltage across gate nodes of the first transistor and the second transistor.

16. The system of claim 14, wherein:
the output current is a differential signal; and
the transconductance circuit is configured to provide the output current at drain nodes of the first transistor and the second transistor.

17. The system of claim 9, wherein the first transistor and the second transistor comprise one or more of a metal-oxide-semiconductor field-effect transistor(MOSFET), fin field-effect transistor (FINFET), bipolar junction transistor (BJT), and junction field-effect transistor.

18. The system of claim 9, wherein the first feedback device is a first resistor and the second feedback device is a second resistor.

19. The system of claim 9, wherein the first source-degeneration device is a first resistor and the second source-degeneration device is a second resistor.

* * * * *